(12) United States Patent
Chen et al.

(10) Patent No.: US 9,147,690 B2
(45) Date of Patent: Sep. 29, 2015

(54) ERASABLE PROGRAMMABLE SINGLE-PLOY NONVOLATILE MEMORY

(71) Applicant: eMemory Technology Inc., Hsin-Chu (TW)

(72) Inventors: Wei-Ren Chen, Pingtung County (TW); Te-Hsun Hsu, Hsinchu County (TW); Wen-Hao Lee, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 13/892,564

(22) Filed: May 13, 2013

(65) Prior Publication Data

US 2013/0248972 A1 Sep. 26, 2013

Related U.S. Application Data

(63) Continuation-in-part of application No. 13/415,185, filed on Mar. 8, 2012, now Pat. No. 8,941,167.

(51) Int. Cl.
*H01L 29/788* (2006.01)
*H01L 27/115* (2006.01)
(Continued)

(52) U.S. Cl.
CPC ...... *H01L 27/11517* (2013.01); *G11C 16/0433* (2013.01); *H01L 27/11558* (2013.01); *H01L 29/66825* (2013.01); *H01L 29/7881* (2013.01); *H01L 29/7887* (2013.01)

(58) Field of Classification Search
CPC ............ H01L 29/808; H01L 21/28273; H01L 27/085; H01L 27/108; H01L 27/115; H01L 29/7887

USPC ........... 257/314–326, 408, 376; 438/201, 211
See application file for complete search history.

(56) References Cited

U.S. PATENT DOCUMENTS 5,591,662 A * 1/1997 Zambrano .................... 438/209
5,736,764 A 4/1998 Chang
(Continued)

FOREIGN PATENT DOCUMENTS

JP 01-262669 10/1989
JP 2003017597 1/2003
(Continued)

OTHER PUBLICATIONS

U.S. Appl. No. 13/572,731, filed Aug. 23, 2012.
(Continued)

*Primary Examiner* — Matthew Landau
*Assistant Examiner* — Eric Ashbahian
(74) *Attorney, Agent, or Firm* — WPAT, PC; Justin King (57) ABSTRACT

An erasable programmable single-poly nonvolatile memory includes a substrate structure; a first PMOS transistor comprising a select gate, a first source/drain region, and a second source/drain region, wherein the select gate is connected to a select gate voltage, and the first source/drain region is connected to a source line voltage; a second PMOS transistor comprising the second source/drain region, a third source/drain region, and a floating gate, wherein the third source/drain region is connected to a bit line voltage and the first, second and third source/drain regions are constructed in a N-well region; and an erase gate region adjacent to the floating gate, wherein the erase gate region comprises a n-type source/drain region connected to an erase line voltage and a P-well region; wherein the N-well region and the P-well region are formed in the substrate structure.

18 Claims, 6 Drawing Sheets

(51) Int. Cl.
*H01L 29/66* (2006.01)
*G11C 16/04* (2006.01)

(56) References Cited

U.S. PATENT DOCUMENTS

| | | | |
|---|---|---|---|
| 5,761,121 A | 6/1998 | Chang | |
| 5,841,165 A | 11/1998 | Chang et al. | |
| 6,071,775 A * | 6/2000 | Choi et al. | 438/257 |
| 6,127,700 A * | 10/2000 | Bulucea | 257/335 |
| 6,166,954 A | 12/2000 | Chern | |
| 6,678,190 B2 | 1/2004 | Yang et al. | |
| 6,711,064 B2 | 3/2004 | Hsu et al. | |
| 7,078,761 B2 | 7/2006 | Wang et al. | |
| 7,595,244 B1 * | 9/2009 | Bulucea et al. | 438/290 |
| 2003/0235082 A1 | 12/2003 | Hsu et al. | |
| 2004/0065917 A1 | 4/2004 | Fan et al. | |
| 2005/0199936 A1 | 9/2005 | Wang et al. | |
| 2008/0006868 A1 | 1/2008 | Hsu et al. | |
| 2008/0266959 A1 * | 10/2008 | Haggag et al. | 365/185.11 |
| 2009/0052245 A1 * | 2/2009 | Li et al. | 365/185.05 |
| 2009/0059678 A1 * | 3/2009 | Strenz et al. | 365/185.29 |
| 2010/0149874 A1 | 6/2010 | Leung et al. | |
| 2010/0157669 A1 * | 6/2010 | Audzeyeu et al. | 365/185.1 |
| 2012/0056257 A1 | 3/2012 | Choi et al. | |
| 2012/0236646 A1 | 9/2012 | Hsu et al. | |
| 2013/0221488 A1 * | 8/2013 | Rao | 257/591 |

FOREIGN PATENT DOCUMENTS

| | | |
|---|---|---|
| JP | 2007-080393 | 3/2007 |
| JP | 2009-081181 | 4/2009 |

OTHER PUBLICATIONS

U.S. Appl. No. 13/602,404, filed Sep. 4, 2012.
European Patent Office, "Search Report", Sep. 3, 2013.
Paola, et al, "Single Poly PMOS-based CMOS-Compatible low voltage OTP", 2005, pp. 953-960, vol. 5837, Proc. of SPIE.
Lin, et al, "A single-poly EEPROM cell structure compatible to standard CMOS process", 2007, pp. 888-893, Solid-State Electronics.
Bartolomeo, et al, "A single-poly EEPROM cell for embedded memory applications", 2009, pp. 644-648, Solid-State Electronics.
Taiwan Intellectual Property Office, "Office Action", Jun. 19, 2014.
Office Action issued by USPTO, Jul. 30, 2014, USA.
Japan Patent Office, "Office Action", Aug. 26, 2014.

* cited by examiner

| | $V_{SL}$ | $V_{NW}$ | $V_{BL}$ | $V_{WL}$ | $V_{EL}$ | $V_{DNW}$ | $V_{PW}$ | mode |
|---|---|---|---|---|---|---|---|---|
| Method1 | $0 \sim V_{EE}$ | $V_{EE}$ | $0 \sim V_{EE}$ | $V_{EE}$ | $-V_{ee}$ | $V_{EE}$ | $-V_{ee}$ | FN |
| Method2 | floating | $V_{EE}$ | 0 | $V_{EE}$ | $-V_{ee}$ | $V_{EE}$ | $-V_{ee}$ | BBHH SHH DAHH |

ERASABLE PROGRAMMABLE SINGLE-PLOY NONVOLATILE MEMORY

This is a continuation-in-part application of co-pending U.S. application Ser. No. 13/415,185, filed Mar. 8, 2012, the subject matter of which is incorporated herein by reference.

FIELD OF THE INVENTION

The present invention relates to a nonvolatile memory, and more particularly to an erasable programmable single-poly nonvolatile memory.

BACKGROUND OF THE INVENTION

Figures 1, 2A, 2B, 2C:
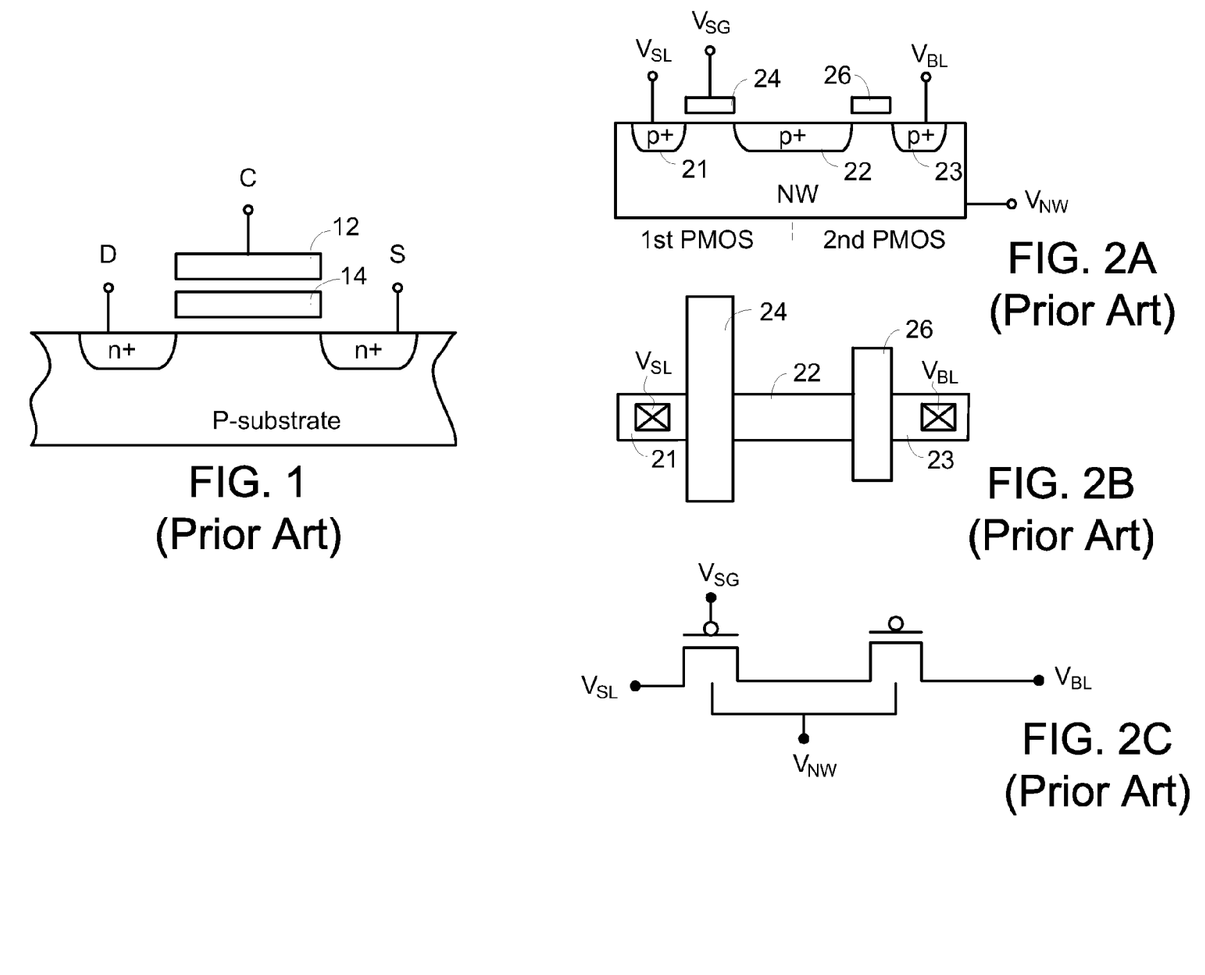
FIG. 1 (prior art) is a schematic cross-sectional view illustrating a conventional programmable dual-poly nonvolatile memory.
FIG. 2A (prior art) is a schematic cross-sectional view illustrating a conventional programmable single-poly nonvolatile memory disclosed in U.S. Pat. No. 6,678,190.
FIG. 2B (prior art) is a schematic top view illustrating the conventional programmable single-poly nonvolatile memory of FIG. 2A.
FIG. 2C (prior art) is a schematic circuit diagram illustrating the conventional programmable single-poly nonvolatile memory of FIG. 2A.

FIG. 1 is a schematic cross-sectional view illustrating a conventional programmable dual-poly nonvolatile memory. The programmable dual-poly nonvolatile memory is also referred as a floating-gate transistor. As shown in FIG. 1, this nonvolatile memory comprises two stacked and separated gates. The upper gate is a control gate 12, which is connected to a control line C. The lower gate is a floating gate 14. In addition, an n-type doped source region and an n-type doped drain region are constructed in a P-substrate. The n-type doped source region is connected to a source line S. The n-type doped drain region is connected to a drain line D.

In a case that the nonvolatile memory is in a programmed state, a high voltage (e.g. +16V) is provided by the drain line D, a ground voltage is provided by the source line S, and a control voltage (e.g. +25V) is provided by the control line C. Consequently, during the electrons are transmitted from the source line S to the drain line D through an n-channel region, the hot carriers (e.g. hot electrons) are attracted by the control voltage on the control gate 12 and injected into the floating gate 14. Under this circumstance, a great number of carriers are accumulated in the floating gate 14. Consequently, the programmed state may be considered as a first storage state (e.g. "0").

In a case that the nonvolatile memory is in a non-programmed state, no carrier is injected into the floating gate 14, and thus the non-programmed state may be considered as a second storage state (e.g. "1").

In other words, the characteristic curves of the drain current (id) and the gate-source voltage (Vgs) (i.e. an id-Vgs characteristic curve) in the first storage state and the id-Vgs characteristic curve in the second storage state are distinguished. Consequently, the storage state of the floating-gate transistor may be realized according to the variation of the id-Vgs characteristic curve.

However, since the floating gate 14 and the control gate 12 of the programmable dual-poly nonvolatile memory should be separately produced, the process of fabricating the programmable dual-poly nonvolatile memory needs more steps and is incompatible with the standard CMOS manufacturing process.

U.S. Pat. No. 6,678,190 discloses a programmable single-poly nonvolatile memory. FIG. 2A is a schematic cross-sectional view illustrating a conventional programmable single-poly nonvolatile memory disclosed in U.S. Pat. No. 6,678,190. FIG. 2B is a schematic top view illustrating the conventional programmable single-poly nonvolatile memory of FIG. 2A. FIG. 2C is a schematic circuit diagram illustrating the conventional programmable single-poly nonvolatile memory of FIG. 2A.

Please refer to FIGS. 2A-2C. The conventional programmable single-poly nonvolatile memory comprises two serially-connected p-type metal-oxide semiconductor (PMOS) transistors. The first PMOS transistor is used as a select transistor, and a select gate 24 of the first PMOS transistor is connected to a select gate voltage $V_{SG}$. A first source/drain region 21 is connected to a source line voltage $V_{SL}$. Moreover, a second source/drain region 22 may be considered as a combination of a p-type drain region of the first PMOS transistor and a p-type source region of the second PMOS transistor. A floating gate 26 is disposed over the second PMOS transistor. A third source/drain region 23 of the second PMOS transistor is connected to a bit line voltage $V_{BL}$. Moreover, these PMOS transistors are constructed in an N-well region (NW). The N-well region is connected to an N-well voltage $V_{NW}$.

By properly controlling the select gate voltage $V_{SG}$, the source line voltage $V_{SL}$, the bit line voltage $V_{BL}$ and the N-well voltage $V_{NW}$, the conventional programmable single-poly nonvolatile memory may be operated in a programmed state or a read state.

Since the two PMOS transistors of the conventional programmable single-poly nonvolatile memory have respective gates 24 and 26, the process of fabricating the conventional programmable single-poly nonvolatile memory is compatible with the standard CMOS manufacturing process.

As described in FIGS. 1 and 2, the nonvolatile memory is programmable. The electrical property of the nonvolatile memory is only utilized to inject a great number of hot carriers to the floating gate. However, the electrical property fails to be utilized to remove the carriers from the floating gate. That is, for achieving the data-erasing function, the carriers stored in the floating gate may be removed from the floating gate by exposing ultraviolet (UV) light to the nonvolatile memory. These nonvolatile memories are named as one time programming (OTP) memories.

Therefore, for multi-times programming (MTP) memories design, there is a need of providing an erasable programmable single-poly nonvolatile memory.

SUMMARY OF THE INVENTION

The present invention provides an erasable programmable single-poly nonvolatile memory in order to obviate the drawbacks encountered from the prior art.

The present invention provides an erasable programmable single-poly nonvolatile memory, comprising: An erasable programmable single-poly nonvolatile memory, comprising: a substrate structure; a first PMOS transistor comprising a select gate, a first source/drain region, and a second source/drain region, wherein the select gate is connected to a select gate voltage, and the first source/drain region is connected to a source line voltage; a second PMOS transistor comprising the second source/drain region, a third source/drain region, and a floating gate, wherein the third source/drain region is connected to a bit line voltage and the first source/drain region, the second source/drain region, and the third source/drain region are constructed in a N-well region; and an erase gate region adjacent to the floating gate, wherein the erase gate region comprises a n-type source/drain region connected to an erase line voltage and a P-well region; wherein the N-well region and the P-well region are formed in the substrate structure.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3A:
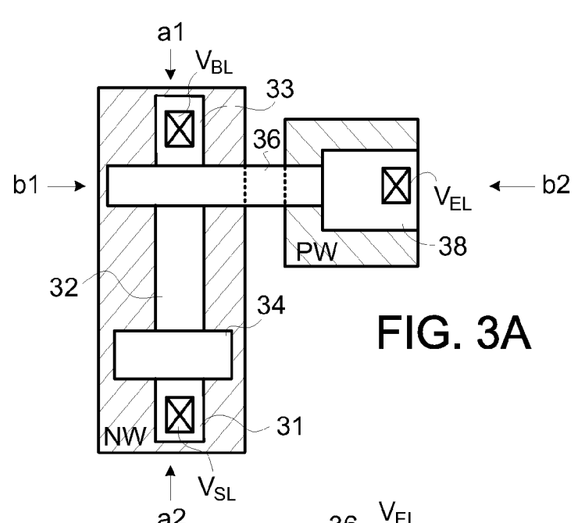
FIGS. 3A~3D schematically illustrate an erasable programmable single-poly nonvolatile memory according to a first embodiment of the present invention.
Figure 3B:
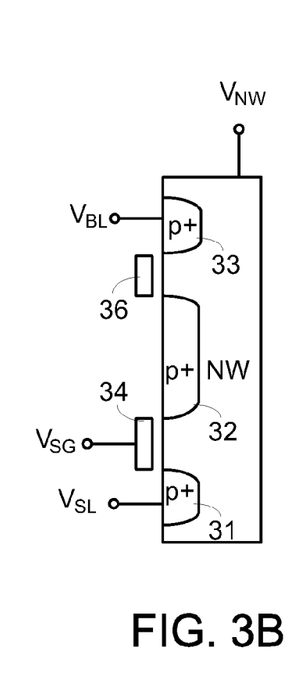
Figure 3C:
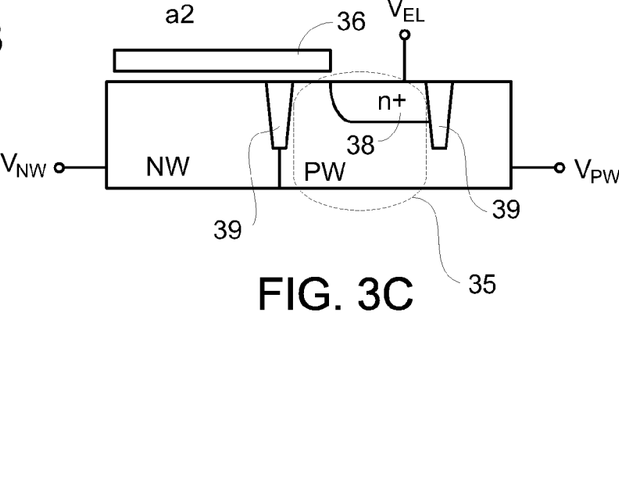

FIGS. 3A~3D schematically illustrate an erasable programmable single-poly nonvolatile memory according to a first embodiment of the present invention. FIG. 3A is a schematic top view illustrating the erasable programmable single-poly nonvolatile memory according to the first embodiment of the present invention. FIG. 3B is a schematic cross-sectional view illustrating the erasable programmable single-poly nonvolatile memory of FIG. 3A and taken along a first direction (a1-a2). FIG. 3C is a schematic cross-sectional view illustrating the erasable programmable single-poly nonvolatile memory of FIG. 3A and taken along a second direction (b1-b2).

Figure 3D:
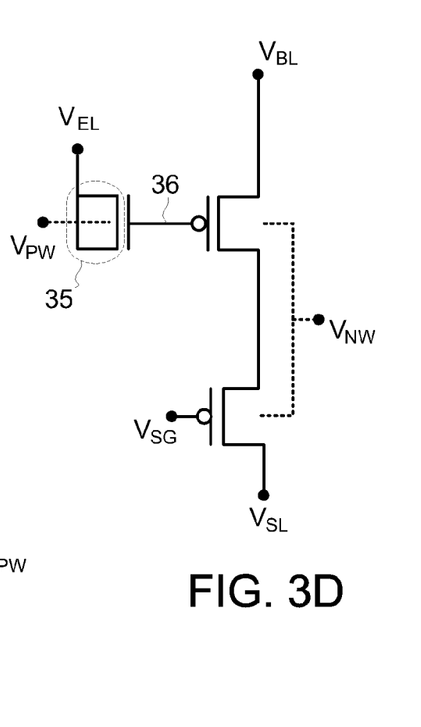

FIG. 3D is a schematic equivalent circuit diagram of the erasable programmable single-poly nonvolatile memory according to the first embodiment of the present invention.

As shown in FIGS. 3A and 3B, the erasable programmable single-poly nonvolatile memory of the first embodiment comprises two serially-connected p-type metal-oxide semiconductor (PMOS) transistors. These two PMOS transistors are constructed in an N-well region (NW). Three source/drain regions 31, 32 and 33 are formed in the N-well region (NW).

In addition, two polysilicon gates 34 and 36 are spanned over the areas between the three source/drain regions 31, 32 and 33.

The first PMOS transistor is used as a select transistor, and the polysilicon gate 34 (also referred as a select gate) of the first PMOS transistor is connected to a select gate voltage $V_{SG}$. The first source/drain region 31 is a p-type source region and connected to a source line voltage $V_{SL}$. The second source/drain region 32 is a p-type drain region, which may be considered as a combination of the p-type drain region of the first PMOS transistor and a p-type source region of the second PMOS transistor. The polysilicon gate 36 (also referred as a floating gate) is disposed over the second PMOS transistor. The third source/drain region 33 is a p-type drain region of the second PMOS transistor and connected to a bit line voltage $V_{BL}$. Moreover, the N-well region (NW) is connected to an N-well voltage $V_{NW}$.

Generally, during the ion implantation processes of forming the source/drain regions 31, 32 and 33, the floating gate 36 and the select gate 34 are used as the implantation mask layers. Consequently, the floating gate 36 and the select gate 34 over the N-well region (NW) are p-type gates.

As shown in FIGS. 3A and 3C, the erasable programmable single-poly nonvolatile memory of the first embodiment comprises an n-type metal-oxide semiconductor (NMOS) transistor or a combination of the floating gate 36 and an erase gate region 35. The NMOS transistor is constructed in a P-well region (PW). An n-type source/drain region 38 is formed in the P-well region (PW). In other words, the erase gate region 35 includes the P-well region (PW) and the n-type source/drain regions 38.

As shown in FIG. 3A, the floating gate 36 is extended to and is adjacent to the erase gate region 35. Moreover, the n-type source/drain region 38 may be considered as a combination of an n-type source region and an n-type drain region of the NMOS transistor and the floating gate 36 may be considered as a gate of the NMOS transistor. The n-type source/drain region 38 is connected to an erase line voltage $V_{EL}$. In addition, the P-well region (PW) is connected to a P-well voltage $V_{PW}$. As shown in FIG. 3C, an isolation structure 39 is formed between the P-well region (PW) and the N-well region (NW). For example, the isolation structure 39 is a shallow trench isolation (STI) structure.

During the ion implantation process of forming the n-type source/drain region 38, the floating gate 36 is used as the implantation mask layer. Consequently, the floating gate 36 over the erase gate region 35 is an n-type gate.

Figure 11A:
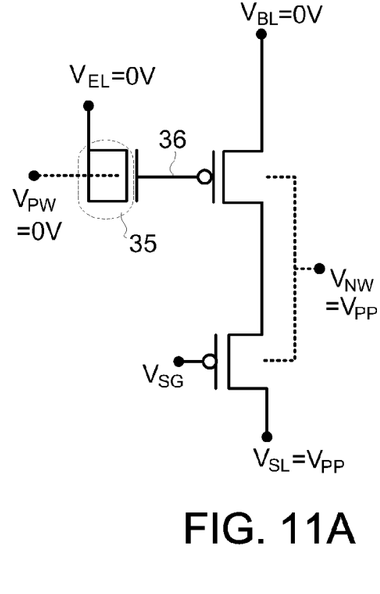
FIGS. 11A~11C schematically and respectively illustrate the bias voltages of the erasable programmable single-poly nonvolatile memory shown in FIG. 3A in a programmed state, an erased state and a read state according to the present invention.
Figure 11B:
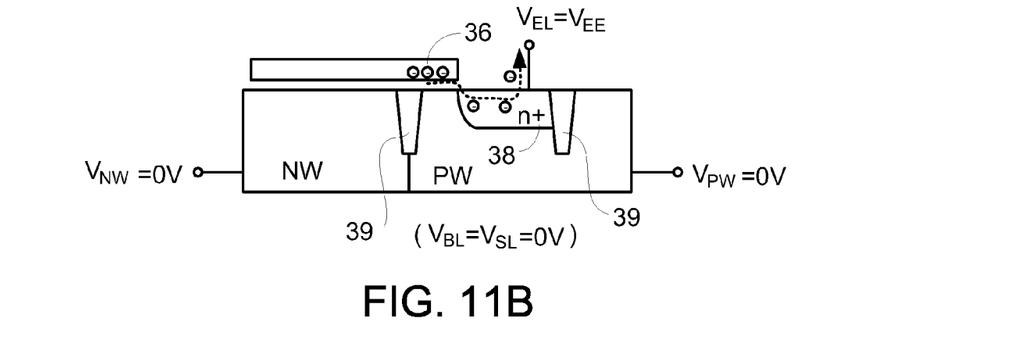
Figure 11C:
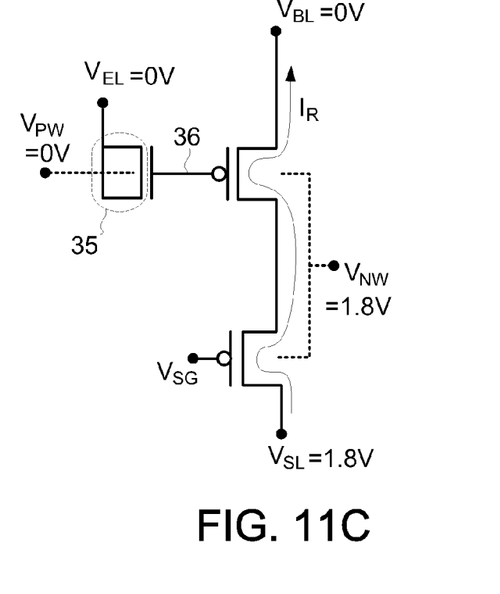

FIGS. 11A~11C schematically and respectively illustrate the bias voltages of the erasable programmable single-poly nonvolatile memory shown in FIG. 3A in a programmed state, an erased state and a read state according to the present invention.

Please refer to FIG. 11A. In the programmed state, each of the bit line voltage $V_{BL}$ the erase line voltage $V_{EL}$ and the P-well voltage $V_{PW}$ is equal to a qround voltage (0V) Whereas each of the N-well voltage $V_{NW}$ and the source line voltage $V_{SL}$ is equal to a first positive voltage $V_{pp}$. The first positive voltage $V_{pp}$ is in the range between +3.0V and +7.5V. In a case that the hot carriers (e.g. electrons) are transmitted through a channel region corresponding to the floating gate 36, the hot carriers are injected into the floating gate 36. Obviously, according to the present invention, the control gate used in the conventional nonvolatile memory for controlling the injection of the hot carriers into the floating gate may be omitted. In addition, the operating principles of the nonvolatile memory of the present invention in the programmed state are similar to those of the conventional nonvolatile memory (see disclosed in U.S Pat. No. 6678190), and are not redundantly described herein.

Please refer to FIG. 11 B. In the erased state, each of the bit line voltage $V_{BL}$, the source line voltage $V_{SL}$ the N-well voltage $V_{NW}$ and the P-well voltage $V_{PW}$ is equal to the ground voltage (0V) Whereas, the erase line voltage $V_{EL}$ is equal to a second positive voltage $V_{EE}$. The second positive voltage $V_{EE}$ is in the range between +6.5V and +18V. As shown in FIG. 4B if the erase line voltage $V_{EL}$ is equal to the second positive voltage $V_{EE}$ the storage carriers (e.g. electrons) are removed from the floating gate 36 and discharged out of the nonvolatile memory through the n-type doped region 38. Consequently, after the erased state, no carrier is stored in the floating gate 36.

Please refer to FIG. 11 C. In the read state, the bit line voltage $V_{BL}$ is equal to ground voltage (0V), the source line voltage $V_{SL}$ is equal to 1.8V, the N-well voltage $V_{NW}$ is equal to 1.8V the erase line voltage $V_{EL}$ is equal to ground voltage (0V), and the P-well voltage $V_{pw}$ is equal to the ground voltage (0V). Depending on whether the hot carriers are stored in the floating gate 36 different magnitudes of the read current $I_R$ are acquired. That is, in the read state, the storage state of the nonvolatile memory may be realized according to the read current $I_R$. For example in the first storage state (e.g. "0" state),the read current $I_R$ is higher than 5µA. In the second storage state (e.g. "1" state), the read current $I_R$ is lower than 0.1µ A. Furthermore the above mentioned bias voltages maybe need not be limited to the fixed voltages. For example, the bit line voltage $V_{BL}$ can be in the ranee between 0V to 0.5V the source line voltage $V_{SL}$ and the N-well voltage $V_{NW}$ can be in the ranee between $V_{DD}$ and $V_{DD2}$ and the erase line voltage $V_{EL}$ can be in the ranee between 0V and $V_{DD2}$ wherein the $V_{DD}$ is the core device voltage of the nonvolatile memory and the $V_{DD2}$ is Io device voltage of the nonvolatile memory.

Figure 4:
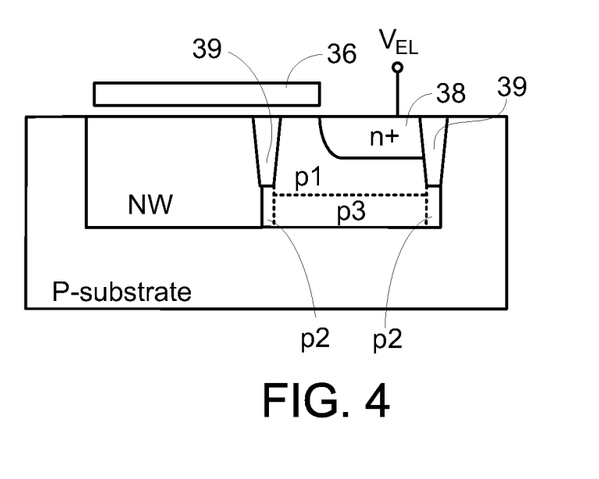
FIGS. 4~6 schematically illustrate different substrate structures and P-well region (PW) applied to the first embodiment of the present invention.

Furthermore, different substrate structures and P-well region (PW) applied to the first embodiment of the present invention will be illustrated in more details as follows. As shown in FIG. 4, the substrate structure is a P-substrate.

The N-well region (NW) and the P-well region (PW) of the first embodiment are formed in the P-substrate. The P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1).

In addition, the first p-type region (p1) is formed under the surface of the P-substrate and contacted to the n-type source/drain region 38; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 4 of the present invention, the junction breakdown voltage between the n-type source/drain region 38 and the first p-type region (p1) is increased and thus the erase efficiency of the erasable programmable single-poly nonvolatile memory is improved.

Figure 5:
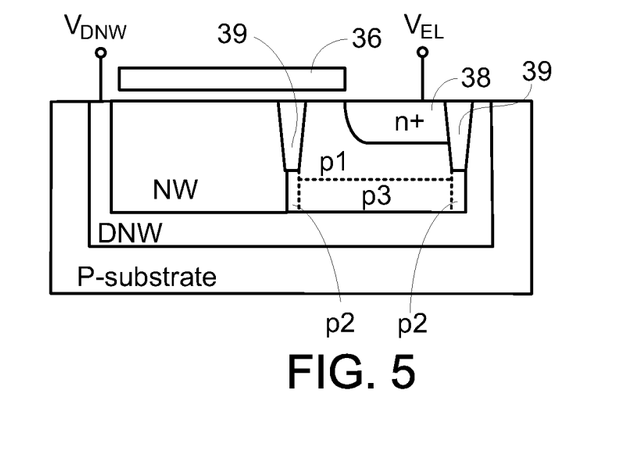

As shown in FIG. 5, the substrate structure includes a deep N-well region (DNW) and a P-substrate. The deep N-well region (DNW) is formed in the P-substrate and the deep N-well region (DNW) is connected to a deep N-well voltage $V_{DNW}$.

The N-well region (NW) and the P-well region (PW) of the first embodiment are formed in the deep N-well region (DNW) of the substrate structure. The P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1).

In addition, the first p-type region (p1) is formed under the surface of the substrate structure and contacted to the n-type source/drain region 38; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 5 of the present invention, the junction breakdown voltage between the n-type source/drain region 38 and the first p-type region (p1) is increased and thus the erase efficiency of the erasable programmable single-poly nonvolatile memory is improved. Furthermore, the two second p-type regions (p2) are capable of improving the lateral punch through effect between the n-type source/drain region 38 and the N-well region (NW); and the third p-type region (p3) is capable of improving the vertical punch through effect between the n-type source/drain region 38 and the deep N-well region (DNW), especially in the high temperature environment.

Figure 6:
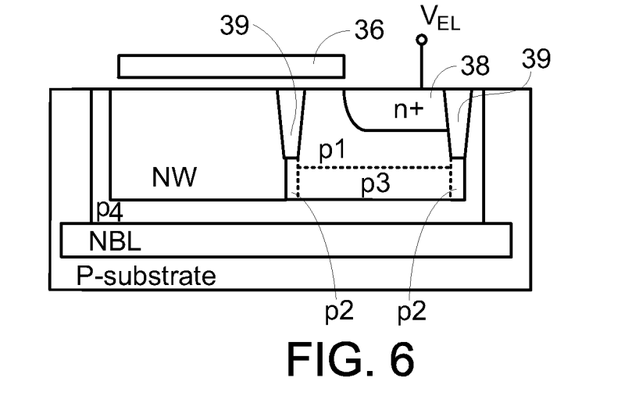

As shown in FIG. 6, the substrate structure includes a fourth p-type region (p4), an n-type barrier layer (NBL, i.e. a second n-type region), and a P-substrate. The n-type barrier layer (NBL) is formed in the P-substrate, and the fourth p-type region (p4) is formed above and contacted to the n-type barrier layer (NBL).

The N-well region (NW) and the P-well region (PW) of the first embodiment are formed in the fourth p-type region (p4) of the substrate structure. The P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1). In addition, the dosage in the fourth p-type region (p4) is equal to the dosage in the P-substrate. Or, the dosage in the fourth p-type region (p4) is higher than or equal to the dosage in the third p-type region (p3) and the dosage in the fourth p-type region (p4) is lower than or equal to the dosage in the second p-type region (p2).

In addition, the first p-type region (p1) is formed under the surface of the substrate structure and contacted to the n-type source/drain region 38; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 6 of the present invention, the junction breakdown voltage between the n-type source/drain region 38 and the first p-type region (p1) is increased and thus the erase efficiency of the erasable programmable single-poly nonvolatile memory is improved. Furthermore, the second p-type regions (p2) are capable of improving the lateral punch through effect between the n-type source/drain region 38 and the N-well region (NW) at higher temperature; and the third p-type region (p3) is capable of improving the vertical punch through effect between the n-type source/drain region 38 and the n-type barrier layer (NBL) at higher temperature. Also, the N-well region (NW) of the first embodiment is isolated by the fourth p-type region (p4) and the P-well region (PW), thus the independent bias voltage is capable of reducing the voltage stress between the floating gate 36 and the N-well region (NW).

Figure 7A:
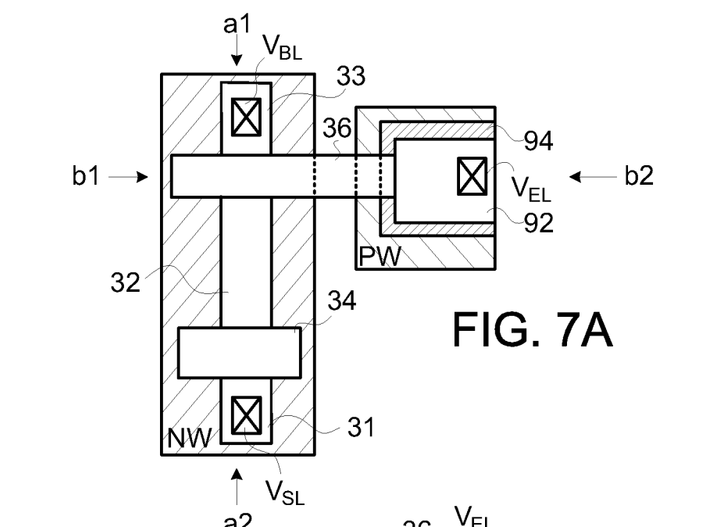
FIGS. 7A~7C schematically illustrate an erasable programmable single-poly nonvolatile memory according to a second embodiment of the present invention.
Figure 7B:
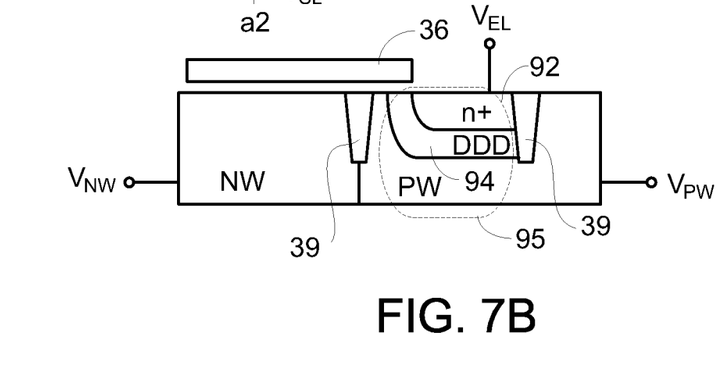
Figure 7C:
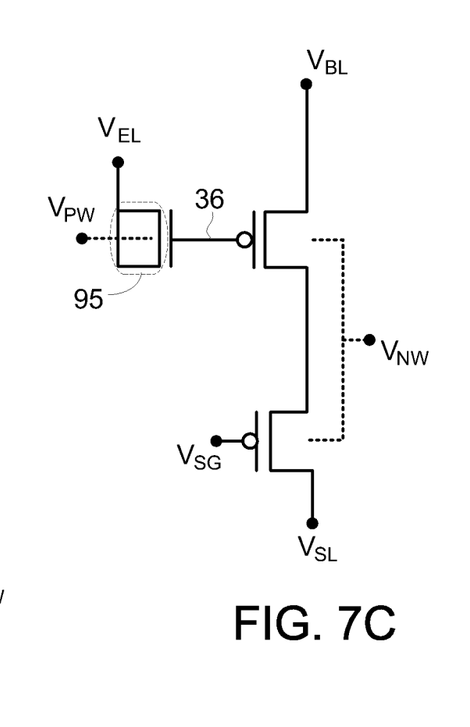

FIGS. 7A~7C schematically illustrate an erasable programmable single-poly nonvolatile memory according to a second embodiment of the present invention. FIG. 7A is a schematic top view illustrating the erasable programmable single-poly nonvolatile memory according to the second embodiment of the present invention. FIG. 7B is a schematic cross-sectional view illustrating the erasable programmable single-poly nonvolatile memory of FIG. 7A and taken along the second direction (b1-b2). FIG. 7C is a schematic equivalent circuit diagram of the erasable programmable single-poly nonvolatile memory according to the second embodiment of the present invention. The cross-sectional view of the erasable programmable single-poly nonvolatile memory of this embodiment along the first direction (a1-a2) is similar to that of the first embodiment, and is not redundantly shown.

As shown in FIG. 7A, the erasable programmable single-poly nonvolatile memory of the second embodiment comprises two serially-connected p-type metal-oxide semiconductor (PMOS) transistors. These two PMOS transistors are constructed in an N-well region (NW). Three source/drain regions 31, 32 and 33 are formed in the N-well region (NW). In addition, two polysilicon gates 34 and 36 are spanned over the areas between the three source/drain regions 31, 32 and 33.

The first PMOS transistor is used as a select transistor, and the polysilicon gate 34 (also referred as a select gate) of the first PMOS transistor is connected to a select gate voltage $V_{SG}$. The first source/drain region 31 is a p-type source region and connected to a source line voltage $V_{SL}$. The second source/drain region 32 is a p-type drain region, which may be considered as a combination of the p-type drain region of the first PMOS transistor and a p-type source region of the second PMOS transistor. The polysilicon gate 36 (also referred as a floating gate) is disposed over the second PMOS transistor. The third source/drain region 33 is a p-type drain region of the second PMOS transistor and connected to a bit line voltage $V_{BL}$. Moreover, the N-well region (NW) is connected to an N-well voltage $V_{NW}$.

As shown in FIGS. 7A and 7B, the erasable programmable single-poly nonvolatile memory of the second embodiment comprises an n-type metal-oxide semiconductor (NMOS) transistor constructed in a P-well region (PW). The NMOS transistor also can be seen as a combination of the floating gate 36 and an erase gate region 95. In other words, the erase gate region 95 includes the P-well region (PW), the n-type source/drain regions 92 and a double diffused drain (DDD) region 94 (i.e. a first n-type region (n1)). In addition, the n-type source/drain region 92 and the double diffused drain (DDD) region 94 are formed in the P-well region (PW). The n-type source/drain region 92 is formed in the double diffused drain (DDD) region 94. In addition, after manufacturing the DDD region 94, the defined mask pattern of manufacturing DDD region 94 is able to be used for etching the gate oxide above the erase gate region 95. That is to say, thickness of the gate oxide above the erase gate region 95 is thinner than the gate oxide under the floating gate 36. In this way, the erase line voltage $V_{EL}$ can be smaller in the typical erased state.

As shown in FIG. 7A, the floating gate 36 is extended to and is adjacent to the erase gate region 95. Moreover, the double diffused drain (DDD) region 94 and the n-type source/drain region 92 may be considered as a combination of an n-type source region and an n-type drain region. The P-well region (PW) is connected to a P-well voltage $V_{PW}$. As shown in FIG. 7B, an isolation structure 39 is formed between the P-well region (PW) and the N-well region (NW).

Figure 8:
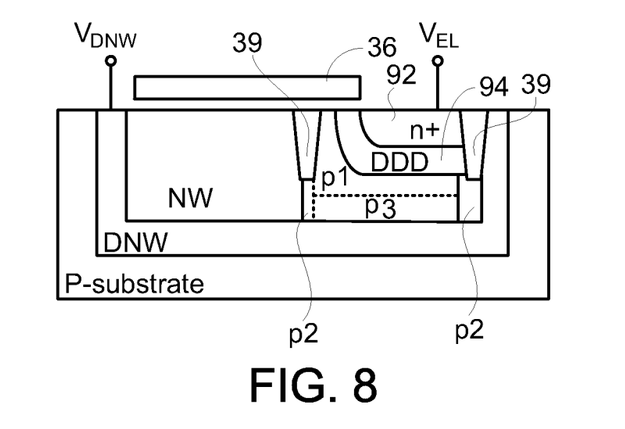
FIGS. 8~9 schematically illustrate different substrate structures and P-well region (PW) applied to the second embodiment of the present invention.

Furthermore, different substrate structures and P-well region (PW) applied to the second embodiment of the present invention will be illustrated in more details as follows. As shown in FIG. 8, the substrate structure includes a deep N-well region (DNW), and a P-substrate. The deep N-well region (DNW) is formed in the P-substrate and the deep N-well region (DNW) is connected to a deep N-well voltage $V_{DNW}$.

The N-well region (NW) and the P-well region (PW) of the second embodiment are formed in the substrate structure. Furthermore, the P-well region (PW) further comprises a first p-type region (p1), two second p-type regions (p2), and a third p-type region (p3). The dosage in the second p-type regions (p2) is higher than or equal to the dosage in the first p-type region (p1). The dosage in the third p-type region (p3) is higher than or equal to the dosage in the first p-type region (p1). The dosage in the N-well region (NW) is higher than or equal to the dosage in the double diffused drain (DDD) region 94. Also, the dosage in the first p-type region (p1) is higher than or equal to the dosage in the double diffused drain (DDD) region 94.

In addition, the first p-type region (p1) is formed under the surface of the substrate structure and contacted to the double diffused drain (DDD) region 94; and the third p-type region (p3) is formed under the first p-type region (p1). Furthermore, the second p-type regions (p2) are formed under the isolation structures 39 and contacted to the first p-type region (p1) and the third p-type region (p3).

According to FIG. 8 of the present invention, the junction breakdown voltage between the double diffused drain (DDD) region 94 (i.e. the first n-type region (n1)) and the first p-type region (p1) is increased and thus the erase efficiency of the erasable programmable single-poly nonvolatile memory is improved. Furthermore, the second p-type region (p2) is capable of improving the lateral punch through effect between the double diffused drain (DDD) region 94 and the N-well region (NW) at higher temperature; and the third p-type region (p3) is capable of improving the vertical punch through effect between the double diffused drain (DDD) region 94 and the deep N-well region (DNW) at higher temperature.

Figure 9:
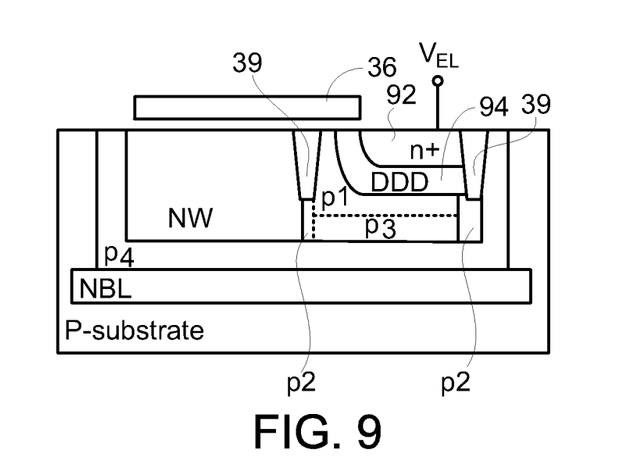

As shown in FIG. 9, the substrate structure includes a fourth p-type region (p4), an n-type barrier layer (NBL, i.e. a second n-type region), and a P-substrate. The n-type barrier layer (NBL) is formed in the substrate structure, and the fourth p-type region (p4) is formed above and contacted to the n-type barrier layer (NBL).

The N-well region (NW) and the P-well region (PW) of the second embodiment are formed in the substrate structure. Furthermore, the P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1). In addition, the dosage in the fourth p-type region (p4) is equal to the dosage in the P-substrate. Or, the dosage in the fourth p-type region (p4) is higher than or equal to the dosage in the third p-type region (p3) and the dosage in the fourth p-type region (p4) is lower than or equal to the dosage in the second p-type region (p2).

In addition, the first p-type region (p1) is formed under the surface of the substrate structure and contacted to the double diffused drain (DDD) region 94 and the third p-type region (p3) is formed under the first p-type region (p1). Furthermore, the second p-type regions (p2) are formed under the isolation structures 39 and contacted to the first p-type region (p1) and the third p-type region (p3).

According to FIG. 9 of the present invention, the junction breakdown voltage between the double diffused drain (DDD) region 94 (i.e. the first n-type region (n1)) and the first p-type region (p1) is increased and thus the erase efficiency of the erasable programmable single-poly nonvolatile memory is improved. Furthermore, the second p-type region (p2) is capable of improving the lateral punch through effect between the double diffused drain (DDD) region 94 and the N-well region (NW) at higher temperature; and the third p-type region (p3) is capable of improving the vertical punch through effect between the double diffused drain (DDD) region 94 and the n-type barrier layer (NBL) at higher temperature. Also, the N-well region (NW) of the first embodiment is isolated by the fourth p-type region (p4) and the P-well region (PW), thus the independent bias voltage is capable of reducing the voltage stress between the floating gate 36 and the N-well region (NW).

Figure 10:
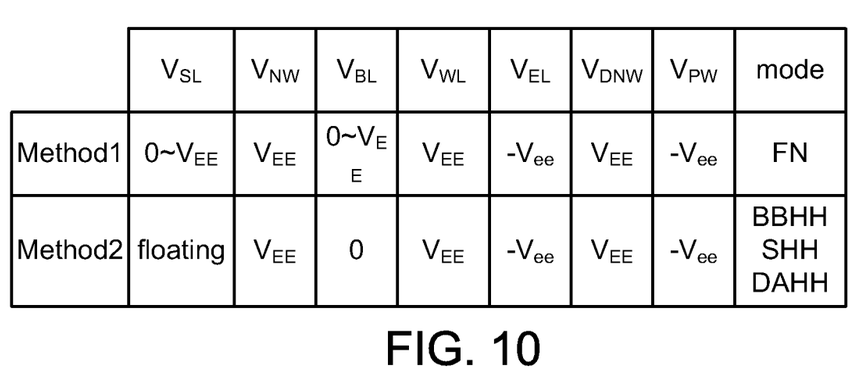
FIG. 10 shows two voltage biasing methods in erased state.

According to the present invention, some biasing voltages may provide to the first and second embodiment constructed in the deep N-well region (DNW) of the substrate structure as shown in FIGS. 5 and 8 in the erased state. FIG. 10 shows two voltage biasing methods in erased state. As shown in FIG. 10, when the first method is used in the erased state, the source line voltage $V_{SL}$ and the bit line voltage is in a range between 0V to a positive voltage $V_{EE}$, the N-well voltage $V_{NW}$ and the word line voltage $V_{WL}$ and the deep N-well voltage $V_{DNW}$ is equal to the positive voltage ($V_{EE}$). Whereas, the erase line voltage $V_{EL}$ and the P-well voltage $V_{pw}$ is equal to a negative voltage $-V_{ee}$. The positive voltage $V_{EE}$ is in the range between +6.5V and +18V and the negative voltage $-V_{ee}$ is in the range between −6.5V and −18V. In this way, the ejection of the storage carriers can be achieved by using Fowler-Nordheim (FN) effect.

As shown in FIG. 10, when the second method is used in the erased state, the source line voltage $V_{SL}$ is floating, and the bit line voltage is in a ground voltage (0V), and the N-well voltage $V_{NW}$ and the word line voltage $V_{WL}$ and the deep N-well voltage $V_{DNW}$ is equal to the positive voltage ($V_{EE}$). Whereas, the erase line voltage $V_{EL}$ and the P-well voltage $V_{PW}$ is equal to a negative voltage $-V_{ee}$. The positive voltage $V_{EE}$ is in the range between +6.5V and +18V and the negative voltage $-V_{ee}$ is in the range between −6.5V and −18V. In this way, the ejection of the storage carriers can be achieved by using Hot Hole (HH) effect, such as, band-to-band hot hole (BBHH) effect, substrate hot hole (SHH) effect, and drain avalanche hot hole (DAHH) effect.

From the above description, the erasable programmable single-poly nonvolatile memory of the present invention is capable of solving the drawbacks of using ultraviolet light to remove hot carriers. That is, by providing the erase line voltage $V_{EL}$, storage state of the nonvolatile memory of the present invention is changeable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable single-poly nonvolatile memory, comprising:

a substrate structure;

a first PMOS transistor comprising a select gate, a first source/drain region, and a second source/drain region, wherein the select gate is connected to a select gate voltage, and the first source/drain region is connected to a source line voltage;

a second PMOS transistor comprising the second source/drain region, a third source/drain region, and a floating gate, wherein the third source/drain region is connected to a bit line voltage and the first source/drain region, the second source/drain region, and the third source/drain region are constructed in a N-well region;

an erase gate region adjacent to the floating gate, wherein the erase gate region comprises a first n-type region connected to an erase line voltage and a P-well region, wherein the N-well region and the P-well region are formed in the substrate structure; and a first isolation structure and a second isolation structure formed in the substrate structure, wherein the first isolation structure is located between the N-well region and the P-well region, and the erase gate region is located between the first isolation structure and the second isolation structure;

wherein a plurality of electrons are transmitted through a channel region of the second PMOS transistor to the floating gate and the electrons are injected into the floating gate in a programmed state; and the electrons are removed from the floating gate and discharged out of the erasable programmable single-poly nonvolatile memory through the first n-type region in an erased state;

wherein the P-well region comprises: a first p-type region formed under a surface of the substrate structure and contacted to the first n-type region; a plurality of second p-type regions formed under the first isolation structure and the second isolation structure; and a third p-type region formed under the first p-type region;

wherein the first p-type region and the third p-type region are located between the second p-type regions, and both the first p-type region and the third p-type region are directly contacted to the second p-type regions; and wherein a dosage in the second p-type regions is higher than a dosage in the first p-type region, and a dosage in the third p-type region is higher than or equal to the dosage in the first p-type region.

2. The erasable programmable single-poly nonvolatile memory as claimed in claim 1, wherein the first n-type region comprises a n-type source/drain region and a double diffused drain region; the n-type source/drain region is connected to the erase line voltage; and the double diffused drain region is formed between the n-type source/drain region and the P-well region.

3. The erasable programmable single-poly nonvolatile memory as claimed in claim 2, wherein the dosage in the first p-type region is higher than or equal to a dosage in the double diffused drain region.

4. The erasable programmable single-poly nonvolatile memory as claimed in claim 1, wherein the substrate structure comprises:

a P-substrate; and a deep N-well region formed in the P-substrate, wherein the deep N-well region is contacted to the N-well region, the second p-type regions and the third p-type region, and the deep N-well region is connected to a deep N-well voltage.

5. The erasable programmable single-poly nonvolatile memory as claimed in claim 1, wherein the substrate structure comprises:

a P-substrate;
a second n-type region formed in the P-substrate; and
a fourth p-type region formed above and contacted to the second n-type region, wherein the fourth p-type region is contacted to the N-well region, the second p-type regions and the third p-type region.

6. The erasable programmable single-poly nonvolatile memory as claimed in claim 5, wherein a dosage in the fourth p-type region is higher than or equal to a dosage in the P-substrate.

7. The erasable programmable single-poly nonvolatile memory as claimed in claim 5, wherein a dosage in the fourth p-type region is higher than or equal to the dosage in the third p-type region, and the dosage in the fourth p-type region is lower than or equal to the dosage in the second p-type region.

8. The erasable programmable single-poly nonvolatile memory as claimed in claim 1, wherein the substrate structure is a P-substrate contacted to the N-well region, the second p-type regions and the third p-type region.

9. The erasable programmable single-poly nonvolatile memory as claimed in claim 1, wherein the first n-type region is a physical combination of an n-type source region and an n-type drain region of a NMOS transistor and the floating gate is a gate of the NMOS transistor and the NMOS is constructed in the P-well region.

10. An erasable programmable single-poly nonvolatile memory, comprising:
a substrate structure;
a first PMOS transistor comprising a select gate, a first source/drain region, and a second source/drain region, wherein the select gate is connected to a select gate voltage, and the first source/drain region is connected to a source line voltage;
a second PMOS transistor comprising the second source/drain region, a third source/drain region, and a floating gate, wherein the third source/drain region is connected to a bit line voltage and the first source/drain region, the second source/drain region, and the third source/drain region are constructed in a N-well region; and
an erase gate region adjacent to the floating gate, wherein the erase gate region comprises a first n-type region connected to an erase line voltage and a P-well region;
wherein a plurality of electrons are transmitted through a channel region of the second PMOS transistor to the floating gate and the electrons are injected into the floating gate in a programmed state; and the electrons are removed from the floating gate and discharged out of the erasable programmable single-poly nonvolatile memory through the first n-type region in an erased state;
wherein the first n-type region comprises a physical combination of an n-type source region and an n-type drain region of a NMOS transistor and the floating gate is a gate of the NMOS transistor and the NMOS is constructed in the P-well region, and the N-well region and the P-well region are formed in the substrate structure.

11. The erasable programmable single-poly nonvolatile memory as claimed in claim 10, wherein the first n-type region comprises the n-type source/drain region and a double diffused drain region; the n-type source/drain region is connected to the erase line voltage; and the double diffused drain region is formed between the n-type source/drain region and the P-well region.

12. The erasable programmable single-poly nonvolatile memory as claimed in claim 10, further comprises:
a first isolation structure formed in the substrate structure; and
a second isolation structure formed in the substrate structure, wherein the first isolation structure is located between the N-well region and the P-well region, and the erase gate region is located between the first isolation structure and the second isolation structure.

13. The erasable programmable single-poly nonvolatile memory as claimed in claim 12, wherein the P-well region comprises: a first p-type region formed under a surface of the substrate structure and contacted to the first n-type region; a plurality of second p-type regions formed under the first isolation structure and the second isolation structure; and a third p-type region formed under the first p-type region;
wherein the first p-type region and the third p-type region are located between the second p-type regions, and both the first p-type region and the third p-type region are directly contacted to the second p-type regions; and
wherein a dosage in the second p-type regions is higher than a dosage in the first p-type region, and a dosage in the third p-type region is higher than or equal to the dosage in the first p-type region.

14. The erasable programmable single-poly nonvolatile memory as claimed in claim 13, wherein the substrate structure comprises:
a P-substrate; and
a deep N-well region formed in the P-substrate, wherein the deep N-well region is contacted to the N-well region, the second p-type regions and the third p-type region, and the deep N-well region is connected to a deep N-well voltage.

15. The erasable programmable single-poly nonvolatile memory as claimed in claim 13, wherein the substrate structure comprises:
a P-substrate;
a second n-type region formed in the P-substrate; and
a fourth p-type region formed above and contacted to the second n-type region, wherein the fourth p-type region is contacted to the N-well region, the second p-type regions and the third p-type region.

16. The erasable programmable single-poly nonvolatile memory as claimed in claim 15, wherein a dosage in the fourth p-type region is higher than or equal to a dosage in the P-substrate.

17. The erasable programmable single-poly nonvolatile memory as claimed in claim 15, wherein a dosage in the fourth p-type region is higher than or equal to the dosage in the third p-type region, and the dosage in the fourth p-type region is lower than or equal to the dosage in the second p-type region.

18. The erasable programmable single-poly nonvolatile memory as claimed in claim 13, wherein the substrate structure is a P-substrate contacted to the N-well region, the second p-type regions and the third p-type region.

* * * * *